(12) United States Patent
Chang et al.

(10) Patent No.: US 11,668,973 B2
(45) Date of Patent: Jun. 6, 2023

(54) ELECTRONIC DEVICE

(71) Applicant: InnoLux Corporation, Miao-Li County (TW)

(72) Inventors: Heng-Chang Chang, Miao-Li County (TW); Chin-Lung Ting, Miao-Li County (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 17/323,046

(22) Filed: May 18, 2021

(65) Prior Publication Data

US 2021/0271134 A1 Sep. 2, 2021

Related U.S. Application Data

(63) Continuation of application No. 16/561,384, filed on Sep. 5, 2019, now Pat. No. 11,042,062.

(60) Provisional application No. 62/741,010, filed on Oct. 4, 2018.

(30) Foreign Application Priority Data

Apr. 30, 2019 (CN) .......................... 201910359564.7

(51) Int. Cl.
*G02F 1/13357* (2006.01)
*H01L 25/075* (2006.01)
*H01L 33/62* (2010.01)
*G02F 1/1335* (2006.01)

(52) U.S. Cl.
CPC .... *G02F 1/133603* (2013.01); *H01L 25/0753* (2013.01); *H01L 33/62* (2013.01); *G02F 1/133612* (2021.01)

(58) Field of Classification Search
CPC ....... G09G 3/3413; H05B 45/00; H05B 45/10
See application file for complete search history.

(56) References Cited

U.S. PATENT DOCUMENTS

| 7,541,726 | B2 * | 6/2009 | Li | H01K 1/14 |
| | | | | 313/315 |
| 10,373,586 | B2 * | 8/2019 | Ye | G02F 1/13452 |
| 2010/0117947 | A1 * | 5/2010 | Kim | C09K 11/595 |
| | | | | 345/102 |
| 2010/0177086 | A1 * | 7/2010 | Nakamura | G09G 3/3258 |
| | | | | 345/211 |

(Continued)

*Primary Examiner* — Andrew J Coughlin
(74) *Attorney, Agent, or Firm* — McClure, Qualey & Rodack, LLP

(57) ABSTRACT

An electronic device is provided. The electronic device includes a substrate; a plurality of first light-emitting elements disposed in a first area of the substrate; a plurality of second light-emitting elements disposed in a second area of the substrate; a first power line disposed on the substrate and electrically connected to the plurality of first light-emitting elements; a second power line disposed on the substrate and electrically connected to the plurality of second light-emitting elements; a first circuit connecting element electrically connected to the first power line; and a first power supply element electrically connected to the first circuit connecting element. A projection of the first area on the substrate does not overlap a projection of the second area on the substrate, and the first area is closer to the first circuit connecting element than the second area.

7 Claims, 7 Drawing Sheets

(56) References Cited

U.S. PATENT DOCUMENTS

2012/0080714 A1* 4/2012 Ikeda ................... H01L 51/002
　　　　　　　　　　　　　　　　　　　　　257/40
2013/0044044 A1* 2/2013 Ha ..................... H01L 27/3276
　　　　　　　　　　　　　　　　　　　　　345/55

* cited by examiner

ELECTRONIC DEVICE

CROSS REFERENCE TO RELATED APPLICATIONS

This application is a Continuation of U.S. patent application Ser. No. 16/561,384, filed on Sep. 5, 2019, now U.S. Pat. No. 11,042,062, which claims priority of U.S. Provisional Patent Application Ser. No. 62/741,010, filed on Oct. 4, 2018, and China Patent Application No. 201910359564.7, filed on Apr. 30, 2019, the entire disclosures of which is hereby incorporated by reference herein.

BACKGROUND

Technical Field

The disclosure relates to an electronic device. In particular, the disclosure relates to an electronic device having an array composed of light-emitting elements.

Description of the Related Art

In order to let users interact with their electronic devices intuitively, a display device is a necessary part of current electronic devices.

An array composed of light-emitting elements may serve as a display panel, e.g., a light-emitting diode display (LED display), or it may serve as a back light source of a non-self-luminous display device (such as liquid-crystal display, LCD display). Therefore, no matter whether it is employed in a self-luminous display device or in a non-self-luminous display device requiring a back light source, an array composed of light-emitting elements plays a significant role.

Although existing light-emitting element arrays have been generally adequate for their intended purposes, they have not been entirely satisfactory in all respects. Therefore, an improvement upon existing light-emitting element arrays is still desired.

SUMMARY

In accordance with some embodiments of the present disclosure, the present disclosure provides an electronic device, including a substrate; a plurality of first light-emitting elements disposed in a first area of the substrate; a plurality of second light-emitting elements disposed in a second area of the substrate; a first power line disposed on the substrate and electrically connected to the plurality of first light-emitting elements; a second power line disposed on the substrate and electrically connected to the plurality of second light-emitting elements; a first circuit connecting element electrically connected to the first power line; and a first power supply element electrically connected to the first circuit connecting element. A projection of the first area on the substrate does not overlap a projection of the second area on the substrate, and the first area is closer to the first circuit connecting element than the second area.

In accordance with other embodiments of the present disclosure, the present disclosure provides an electronic device, including: a substrate comprising a first area and a second area; a plurality of first light-emitting elements disposed in the first area of the substrate; a plurality of second light-emitting elements disposed in the second area of the substrate; a first connecting line disposed on the substrate, wherein the first connecting line is electrically connected to the plurality of first light-emitting elements; a second connecting line disposed on the substrate, wherein the second connecting line is electrically connected to the plurality of second light-emitting elements; a flexible connecting element; and a circuit element, wherein the first connecting line and the second connecting line are electrically connected to the circuit element through the flexible connecting element.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
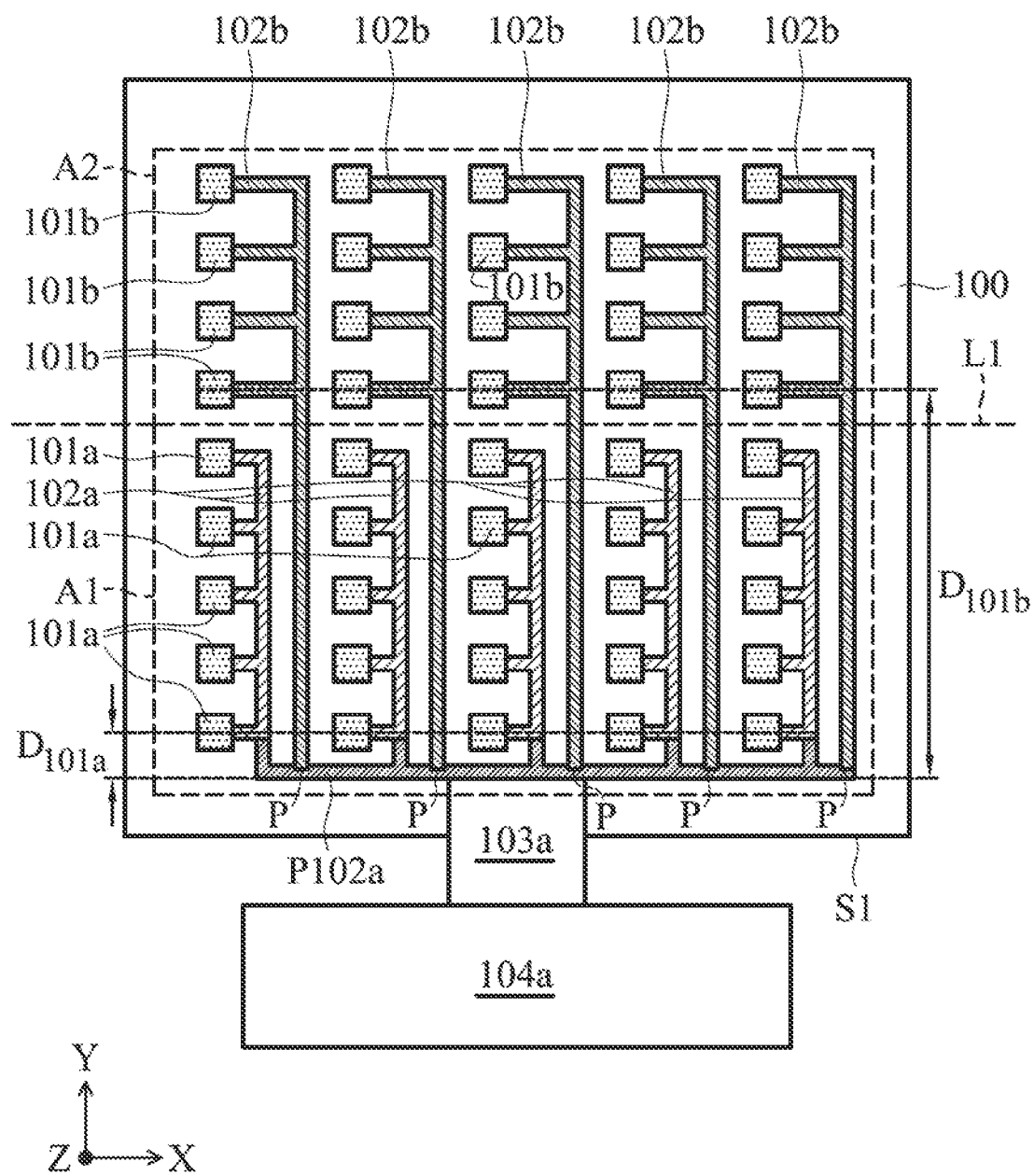
FIGS. 1 to 7 are schematic top-views of electronic devices 10, 30, 40, 50, 60, 70 and 80 respectively in accordance with some embodiments of the present disclosure.

The display device and the fabricating method thereof provided in the present disclosure are described in the following detailed description. In the following detailed description, it should be noted that one or more embodiments are provided to illustrate the present application. The specific elements and configurations described in the following detailed description are merely used to clearly describe the present disclosure, and the scope of the present application is not intended to be limited by the specific element and configuration. Features in different embodiments may be combined as long as the combination does not violate the spirit of the present disclosure. In addition, various embodiments may use like reference numerals to clearly describe the present disclosure. However, the like reference numerals does not indicate a correlation between various embodiments and structures.

It should be noted that the elements or devices in the drawings of the present disclosure may be present in any form or configuration known to those with ordinary skill in the art. In addition, in this specification, relative expressions are used. For example, "lower", "bottom", "higher" or "top" are used to describe the position of one element relative to another. It should be appreciated that if a device is flipped upside down, an element that is "lower" will become an element that is "higher". The description of the exemplary embodiments is intended to be read in connection with the accompanying drawings, which are to be considered part of the entire written description. It should be noted that the drawings are not drawn to scale. In addition, structures and devices are shown schematically in order to simplify the drawing and clearly express the features.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The terms "about" and "substantially" typically mean +/−5% of the stated value, more typically +/−3% of the stated value and even more typically +/−1% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

In some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. In addition, it should be understood that terms concerning covering and the like refer to a relationship wherein the covered object may be directly contacted, or may be a portion of projection of the covered object overlaps a projection of a covering object, while the covering object and the covered object do not directly contact with each other.

In a light-emitting array, as a display area increases, a required corresponding light-emitting area should be increased as well. Therefore, the length of the wire on the substrate is getting longer, and thus the driving current of the light-emitting elements on the same wire that is remote from a power supply component is lower than the driving current of the light-emitting component that is closer to the power supply component. It will result in that the luminous intensity of the light-emitting elements remote from the power supply component is weaker than that of the light-emitting elements close to the power supply component. The luminous intensity of the whole light-emitting array become uneven and a display device including such a light-emitting array may not provide desirable watching experience due to the aforementioned reason.

Therefore, by adjusting the configuration of wires in the light-emitting array, the present disclosure provides an electronic device which may reduce the effect of impedance (or resistance) on the luminous intensity, such that the light-emitting elements in different areas may still have close/or the same luminous intensity.

It should be noted that the term "array" may be any suitable arrangement. For example, in some embodiments of the present disclosure, the "array" may be a rectangular array. Under some circumstances, the array may be a single row rectangular array or a single column rectangular array, such as a 1×n array wherein n is an integer which is equal to or greater than 2. Under some circumstances, the array may be a square array (m×m) or other kinds of rectangular arrays (m×n), wherein m and n are integers which are equal to or greater than 2, and m is different from n. Under some circumstances, the array may be a trapezoid array, a hexagon array, or any kind of array that the relative positions of the light-emitting elements are arranged regularly or randomly. In some embodiments, the light-emitting elements may be disposed unevenly. For clarity purposes, the light-emitting elements in figures of the present disclosure are all arranged in a rectangular array.

Referring to FIG. 1, a schematic top-view of the electronic device 10 is shown. Namely, FIG. 1 is a schematic top-view by observing the electronic device 10 along the normal direction of a substrate 100 (Z direction in FIG. 1). In some embodiments, the electronic device 10 may include a substrate 100, a plurality of first light-emitting elements 101a, a plurality of second light-emitting elements 101b, a first power line 102a, a second power line 102b, a first circuit connecting element 103a and a first power supply element 104a. A first area A1 and a second area A2 may be defined on the substrate 100. The first area A1 and the second area A2 are defined in a manner that in a top view of the electronic device 10, using a first side S1 of the substrate 100 which is closest to the first circuit connecting element 103a as a reference line, the substrate 100 may be divided by a line L1 parallel to the first side S1 into the first area A1 and the second area A2. The first area A1 is closer to the first circuit connecting element 103a than the second area A2. If the first light-emitting elements 101a are arranged in a staggered way, the first side S1 may not be a straight line, so the line L1 may not be a straight line either, and may vary depending on the requirement of the design. The present disclosure is not particularly limited.

Still referring to FIG. 1, the plurality of the first light-emitting elements 101a and the plurality of the second light-emitting elements 101b are disposed on the substrate 100. The plurality of the first light-emitting elements 101a are disposed in the first area A1 of the substrate 100, and the plurality of the second light-emitting elements 101b are disposed in the second area A2. Therefore, it can be regarded that the first area A1 is defined by the plurality of the first light-emitting elements 101a; and the second area A2 is defined by the plurality of the second light-emitting elements 101b. Since the projection of the first area A1 on the substrate 100 and does not overlap the projection of the second area A2 on the substrate 100, the first light-emitting elements 101a and the second light-emitting elements 101b would not be arranged in a staggered way (such as alternately) along the Y direction.

In some embodiments, as shown in FIG. 1, when the first light-emitting elements 101a and the second light-emitting elements 101b are arranged to form a rectangular array (such as a 9×5 rectangular array as shown in FIG. 1), among the light-emitting elements in the same column (along Y direction in FIG. 1), there is a minimum distance $D_{101b}$ between one of the second light-emitting elements 101b and the first circuit connecting element 103a, and there is a minimum distance $D_{101a}$ between one of the first light-emitting elements 101a and the first circuit connecting element 103a. The minimum distance $D_{101b}$ is greater than the minimum distance $D_{101a}$.

Still referring to FIG. 1, in some embodiments, a first power line 102a of the electronic device 10 is disposed on the substrate 100 and electrically connected to the first light-emitting elements 101a. A second power line 102b is also disposed on the substrate 100 and electrically connected to the second light-emitting elements 101b. In the present disclosure, the power line that electrically connects the first light-emitting elements 101a in the first area A1 is defined as the first power line 102a. The power line that electrically connects the second light-emitting elements 101b in the second area A2 is defined as the second power line 102b. In the embodiments as shown in FIG. 1, there are five first power lines 102a in the first area A1 and five second power lines 102b in the second area A2, but the disclosure is not limited thereto and may be adjusted depending on actual need. The first power lines 102a is electrically connected to the first power supply element 104a through the first circuit connecting element 103a. In addition, it should be noted that the position of the power lines is only for illustrative purposes, but the disclosures is not limited thereto. For example, the power lines may not be straight lines, and the corner may not be a right angle. The corner may be an arc shape to decrease the probability of electrostatic discharge, or may be any other suitable shape or angle.

The first circuit connecting element 103a may be any suitable element which is capable of electrically connecting the first power line 102a and the first power supply element 104a. For example, the first power line 102a and the first power supply element 104a may be electrically connected by means of a flexible printed circuit (FPC), a flexible flat cable (FFC), a metal wire (such as a wire including gold, silver, copper, iron, lead, chromium, tin, molybdenum, neodymium, titanium, tantalum, an alloy thereof, or a combination thereof). The electrically connecting may be conducted in any suitable way. For instance, to electrically connect the first circuit connecting element 103a and the first power lines 102a, an anisotropic conductive film (ACF) may be first applied to the position of the first power lines 102a to be connected, and then the first circuit connecting element 103a may be disposed on the anisotropic conductive film followed by a hot pressing process to achieve the electrical connection. The anisotropic conductive film described herein is a conductive film formed by a polymer layer possessing anisotropic conductivity and adhesivity (such as a film type adhesive formed by dispersing conductive particles in an epoxy resin), which enables conduction vertically (along the direction of the film thickness) and insulation between terminals (along the direction of the film width). When the first circuit connecting element 103a is a metal wire, the electrical connection between the elements could be achieved by soldering.

The first power supply element 104a in the electronic device 10 may be a driving circuit providing a driving voltage for the first light-emitting elements 101a and the second light-emitting elements 101b, wherein the driving circuit may be disposed on any suitable circuit substrate. For example, the circuit substrate of the first power supply element 104a may be a print circuit board (PCB), a metal core PCB (MCPCB), a ceramic PCB, or a directed bonded copper substrate (DBC). In some embodiments, the circuit substrate of the first power supply element 104a may be disposed on the back side of the substrate 100 (the side where the first light-emitting elements 101a and the second light-emitting elements 101b are not disposed). The first power supply element 104a electrically connects the first power line 102a through the first circuit connecting element 103a, which allows the first power supply element 104a to provide driving signals to the first power line 102a.

Still referring to FIG. 1, the second power line 102b in the electronic device 10 electrically connect to the part P102a of the first power line 102a where has yet to load the first light-emitting elements 101a (for example, the part P102a may be a portion of the first power line 102a between the first circuit connecting element 103a and the first light-emitting elements 101a which are closest to the first circuit connecting element 103a), so as to form a parallel circuit between the second light-emitting elements 101b and the first light-emitting elements 101a. In some embodiments as shown in FIG. 1, the connecting point P between the second power line 102b and the part P102a of the first power line 102a where has yet to load the first light-emitting elements 101a is located between the first light-emitting elements 101a and the first circuit connecting element 103a.

It should be noted that if other kinds of circuit connecting arrangements are used, for example, the second power line 102b in FIG. 1 directly connects the terminal of the first power line 102a, when the driving current is supplied from the first power supply element 104a to the remote second light-emitting element 101b in the second area A2, since the current needs to pass through the first power line 102a before arriving to the second power line 102b, the loading caused by the first light-emitting elements 101a on the first power line 102a will increase the impedance (resistance) of the first power line 102a. Therefore, the brightness of the second light-emitting elements 101b in the second area A2 will be lower than that of the first light-emitting elements 101a in the first area A1. The brightness of the first light-emitting elements 101a and the second light-emitting elements 101b decreases along the Y direction, which causes a problem of uneven brightness.

Compared with the above circuit connecting arrangement, the second power line 102b electrically connecting the second light-emitting elements 101b does not directly contact the terminal part of the first power line 102a, but electrically connects the part P102a of the first power line 102a where has yet to load the first light-emitting elements 101a (for example, the part P102a may be a portion of the first power line 102a between the first circuit connecting element 103a and the first light-emitting elements 101a which are closest to the first circuit connecting element 103a). Thus, the connection of the first circuit line 102a and the second circuit line 102b precedes the connection of the first circuit line 102a and the first light emitting elements 101a. Therefore, when the first power supply element 104a supplies current to the second light-emitting elements 101b in the second area A2, the current does not have to pass the portion of first power line 102a where is loaded with the first light-emitting elements 101a before arriving at the second power line 102b and the second light emitting elements 101b. Therefore, the impedance (resistance) of the second circuit line 102b in the electronic device 10 may be reduced, so the brightness of the second light-emitting elements 101b of the second area A2 in the electronic device 10 would not fall excessively, and may have a brightness close to that of the first light-emitting elements 101a of the first area A1. As such, the first area A1 and the second area A2 at a remote distance of the electronic device 10 may produce a relatively close brightness.

In some embodiments, the number of second light-emitting elements 101b loaded on the second power line 102b is lower than the number of first light-emitting elements 101a loaded on the first power line 102a. In some other embodiments, when the first light-emitting elements 101a and the second light-emitting elements 101b together to form a rectangular array, the number of second light-emitting elements 101b on the same row (along Y direction in FIG. 1) is less than the number of first light-emitting elements 101a. As such, the luminous intensity (brightness) of the second light-emitting elements 101b in the second area A2 can be further adjusted or the overall brightness uniformity of the light-emitting array can be improved.

The substrate 100 described in the present disclosure may be any suitable rigid or flexible substrate that is capable of carrying with light-emitting elements. The materials of the substrate 100 may be glass, ceramics (such as tantalum carbide, aluminum nitride), sapphire, plastic (such as fiberglass-reinforced plastics (FRP), polyester film, polyethylene terephthalate (PET), polyethylene naphthalate (PEN) and polyethersulfone (PES), an acrylic resin film, or any other suitable material for the substrate.

In some embodiments, the first power line 102a and the second power line 102b may be formed on the substrate 100 by one or more deposition processes, photolithography processes, and etching processes, when the material of the substrate 100 is suitable for or is required according to actual need. For example, in some embodiments, the deposition process may include a chemical vapor deposition process, a physical vapor deposition process, an electroplating process, an electroless plating process, other suitable processes, or a combination thereof, but is not limited thereto. The physical vapor deposition process may include, but is not limited to, a sputtering process, an evaporation process, pulsed laser deposition, and the like processes. In addition, in some embodiments, the photolithography process may include photoresist coating (e.g., spin coating), soft baking, hard baking, mask alignment, exposure, post-exposure baking, photoresist development, cleaning and drying. In some embodiments, the etching process mentioned above includes a dry etch process, a wet etch process, or other suitable etch processes. In some other embodiments, the first power line and the second first power line may be a single metal layer or a multi-layered metal structure.

The material of first power line 102a and the second power line 102b is not particularly limited as long as the material possesses conductivity. For example, it may be formed of a metallic conductive material, an amorphous silicon, a polycrystalline silicon, a metal nitride, a conductive metal oxide, or a combination thereof. In some embodiments, the metallic conductive material may include copper, silver, tin, aluminum, molybdenum, tungsten, gold, chromium, nickel, platinum, copper alloy, silver alloy, tin alloy, aluminum alloy, molybdenum alloy, tungsten alloy, gold alloy, chromium alloy, nickel alloy, platinum alloy, other suitable electrically conductive materials, or a combination thereof, but is not limited thereto. The metal nitrides may include, but are not limited to, molybdenum nitride, tungsten nitride, titanium nitride, and tantalum nitride. The conductive metal oxide may include, but is not limited to, ruthenium oxide, indium zinc oxide, indium gallium zinc oxide (IGZO), indium tin zinc oxide (ITZO), antimony tin oxide (ATO), aluminum zinc oxide (AZO), aluminum zinc oxide, zinc oxide, and indium tin oxide.

The first light emitting element 101a and the second light emitting element 101b may be any suitable light emitting device. For example, the light emitting device may include an electroluminescence (EL) element (such as an organic EL element or an inorganic EL element), an organic light emitting diode (OLED), and an inorganic light emitting diode (Light-emitting diode, LED) (for example: micro LED, mini LED), a quantum dot light emitting diode (Q-LED), a laser diode (LD), and so on.

Figure 2:
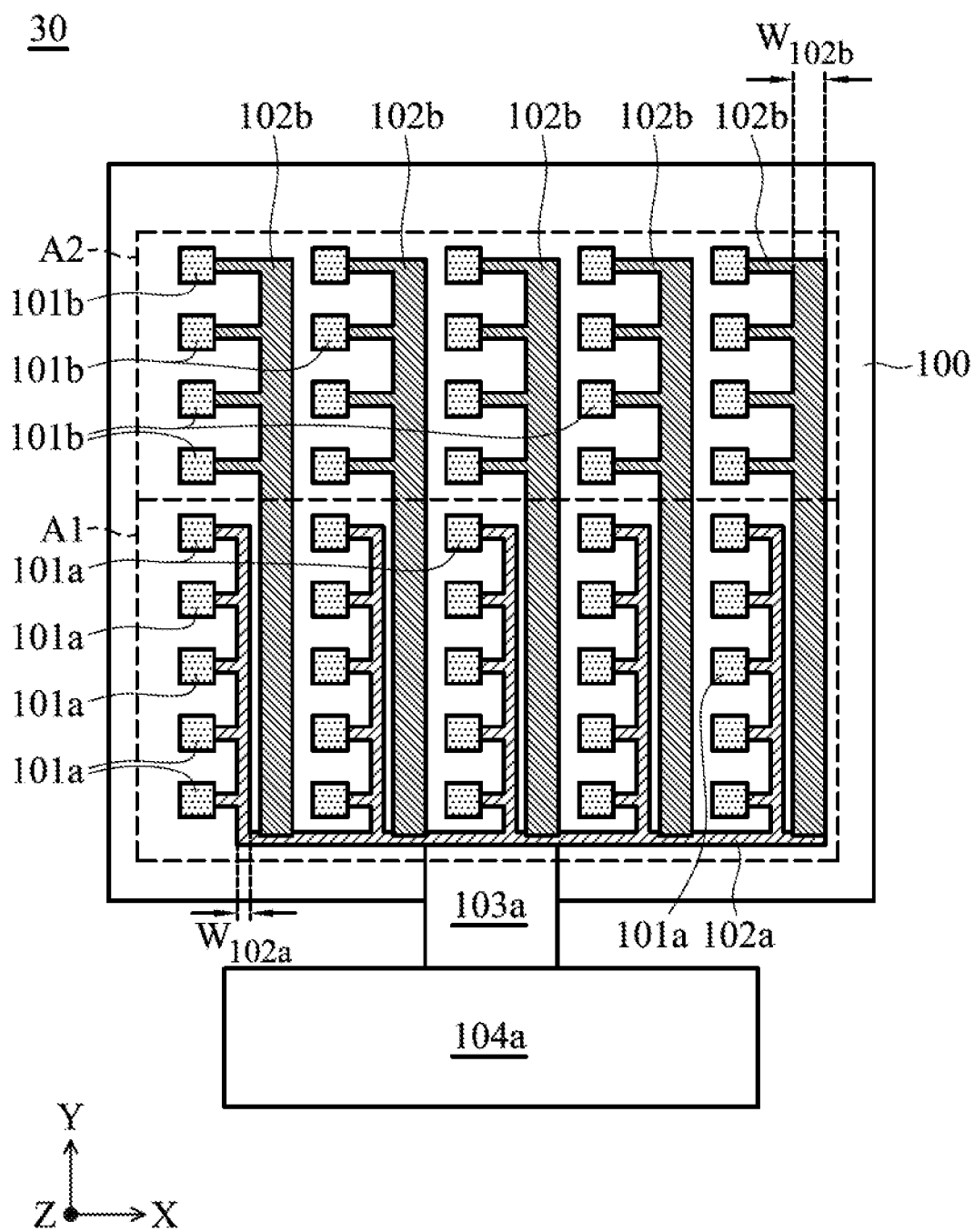

Next, please refer to FIG. 2. FIG. 2 is a schematic top-view of an electronic device 30 in accordance with some embodiments of the present disclosure. The electronic device 30 is substantially the same as the electronic device 10 of FIG. 1 except that the width $W_{102b}$ of the second power line 102b extending in the X direction is greater than the width $W_{102a}$ of the first power line 102a extending in the X direction. As such, the impedance (resistance) of the second power line 102b can be further reduced, and by making the impedance (resistance) of the second power line 102b lower than the impedance (resistance) of the first power line 102a, the luminous intensity of the second light emitting elements 101b at farther place may be much closer to that of the first light emitting elements 101a, so as to enhance the overall brightness uniformity. When the first power line 102a and the second power line 102b have a multi-layered structure, the widths $W_{102a}$ and $W_{102b}$ are the maximum widths of the multi-layered structure.

In some other embodiments, the thickness of the second power line 102b may be greater than the thickness of the first power line 102a, and the impedance (resistance) of the second power line 102b may be reduced. In some embodiments, the thickness of the second power line 102b and the width $W_{102b}$ of the second power line 102b extending in the X direction may be greater than the thickness of the first power line 102a and the width $W_{102a}$ of the first power line 102a extending in the X direction, respectively. That is, as long as the cross-sectional area of the second power line 102b is greater than the cross-sectional area of the first power line 102a, the purpose of making the impedance (resistance) of the second power line 102b lower than the impedance of the first power line 102a may be accomplished. In some embodiments, the width $W_{102b}$ of the second power line 102b extending in the X direction is between 200% and 600% of the width $W_{102a}$ of the first circuit supply line 102a extending in the X direction. In some embodiments, the thickness of the second power line 102b is between 200% and 600% of the thickness of the first power line 102a. When the first power line 102a and the second power line 102b are multi-layered, the widths $W_{102a}$ and $W_{102b}$ are the maximum width of the multi-layered structure, and the thickness thereof is the total thickness of the first power line 102a and the total thickness of the second power line 102b.

In some other embodiments, the first power line 102a and the second power line 102b may be formed of different materials. For example, the impedance (resistance) of the second power line 102b material is less than the impedance (resistance) of the first power line 102a material. In such a case, even if the cross-sectional area of the first power line 102a and that of the second power line 102b are the same, the impedance (resistance) of the second power line 102b may still be lower than the impedance (resistance) of the first power line 102a. In some embodiments, the impedance (resistance) of the second power line 102b material may be 1% to 30% of the impedance (resistance) of the first power line 102a material.

Figure 3:
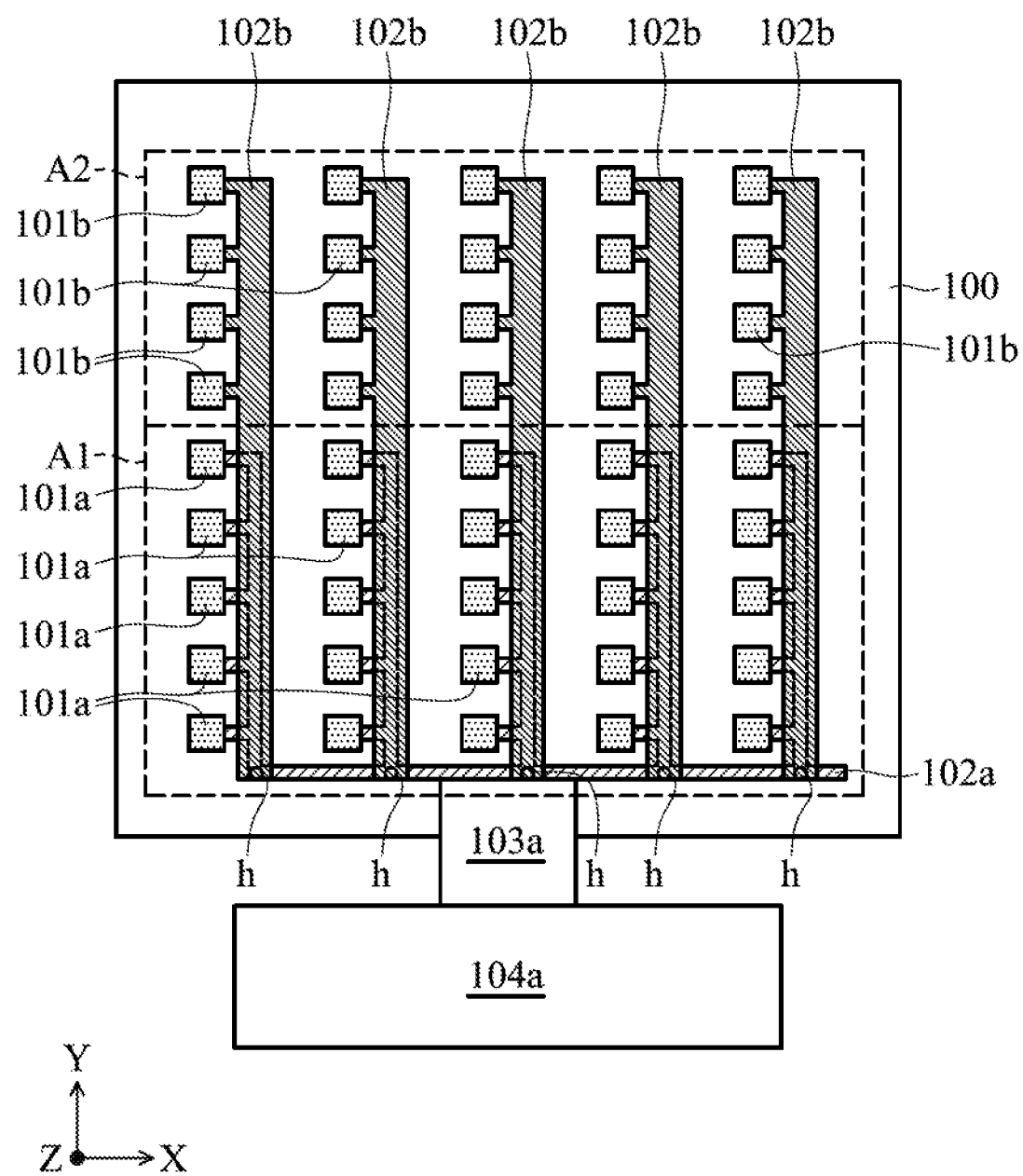

Next, please refer to FIG. 3. FIG. 3 is a schematic top-view of an electronic device 40 in accordance with further embodiments of the present disclosure. The electronic device 40 is substantially the same as the electronic device 30 in FIG. 2, and the difference is that part of the power line 102b and the part of the power line 102a loaded with the first light-emitting elements 101a (that is, the portion except the part P102a in FIG. 1) overlaps in the normal direction of a main surface of the substrate 100 (in the Z direction in FIG. 3), that is, when the substrate 100 is viewed from its top, the second power line 102b covers a portion of the first power line 102a (the portion of the power line 102a covered by the second power line 102b is indicated by a broken line in FIG. 3). In the overlap portion, an insulating layer may be disposed between the first power line 102a and the second power line 102b to provide electrical isolation between them. A via hole h in the insulating layer may be formed to electrically connect a portion of the first power line 102a to a portion of the second power line 102b that are required to be electrically connected. With such a circuit arrangement, the area of the substrate occupied by the first power line 102a and the second power line 102b can be greatly reduced, and the distance between the adjacent two rows (arranged in the Y direction) can be decreased, and thereby the number of light-emitting elements per unit area may be further increased and the resolution or brightness per unit area will be improved as well.

The material of the insulating layer is not particularly limited as long as it can electrically isolate the first power line 102a and the second power line 102b. For example, it may be silicon oxide, silicon nitride, silicon oxynitride, metal oxide, metal nitride, metal silicide, transition metal oxide, transition metal nitride, transition metal silicide, metal oxynitride, metal aluminate salt, zirconium silicate, any other suitable material, or a combination thereof. In some embodiments, the insulating layer may be formed by, for example, chemical vapor deposition (CVD), physical vapor deposition (PVD), or spin coating, wherein the physical vapor deposition may be implemented by evaporation, sputtering, and so on. The chemical vapor deposition may be low pressure chemical vapor deposition (LPCVD), plasma enhanced chemical vapor deposition (PECVD) or other general methods.

Figure 4:
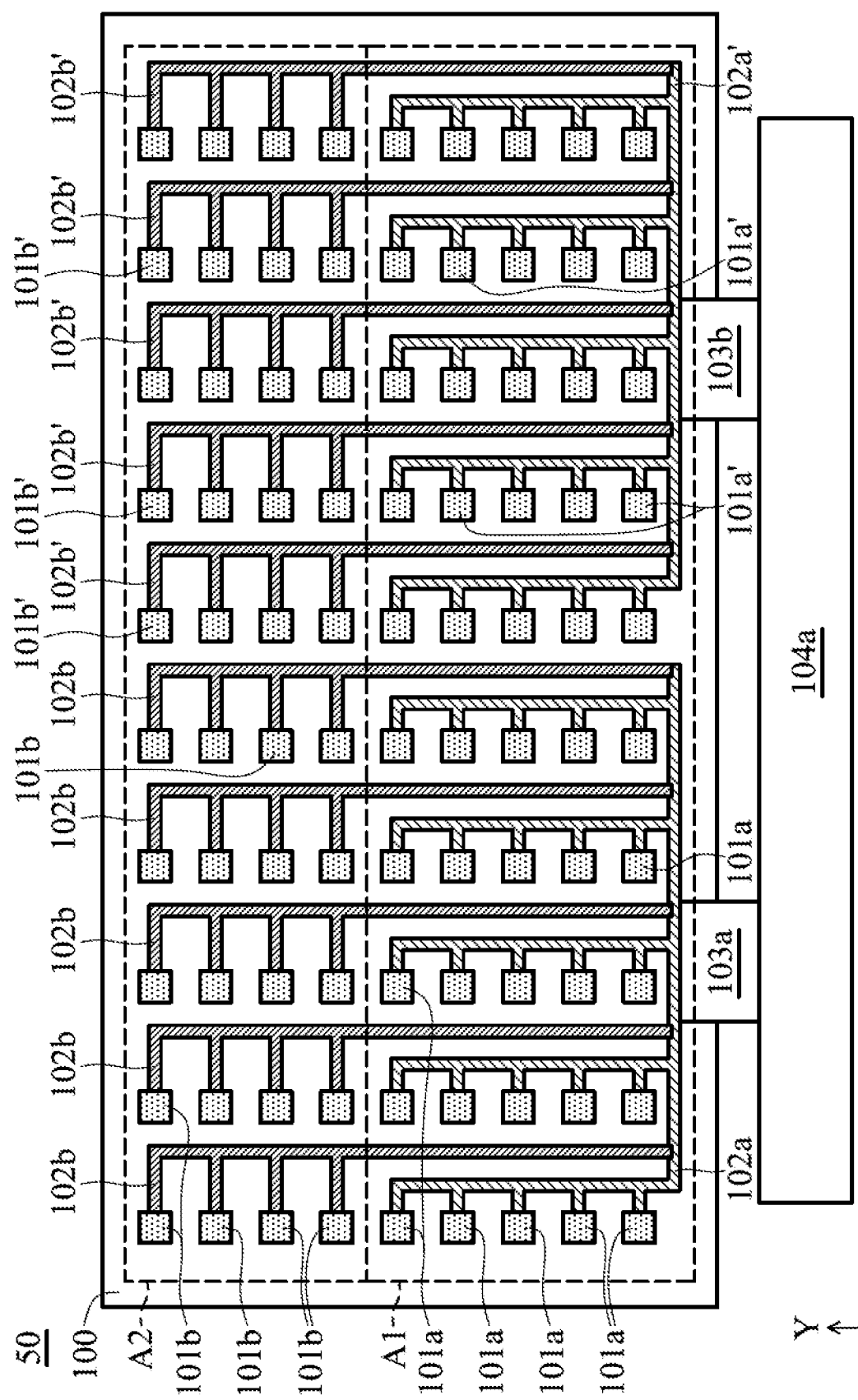

Next, please refer to FIG. 4. FIG. 4 is a schematic top-view of electronic device 50 in accordance with some embodiments of the present disclosure. The electronic device 50 may be considered to be two electronic devices 10 disposed side-by-side and both of the devices shares the same first power supply element 104a. Therefore, in addition to the original first light-emitting element 101a, the second light-emitting element 101b, the first power line 102a, and the second power line 102b, the substrate 100 further includes other first light-emitting elements 101a' and other second light-emitting elements 101b', the other first power line 102a', and the other second power line 102b'.

The first light-emitting elements 101a' are also disposed in the first area A1 of the substrate 100; and the second light-emitting elements 101b' are also disposed in the second area A2 of the substrate 100. The first power line 102a' is disposed on the substrate 100 and electrically connected to the first light emitting element 101a'. The second power line 102b' is disposed on the substrate 100 and electrically connected to the second light emitting element 101b'. The first power line 102a' is electrically connected to the second circuit connecting element 103b, and the second circuit connecting element 103b is electrically connected to the first power supply element 104a.

The first light emitting element 101a', the second light emitting element 101b', the first power line 102a', the second power line 102b', and the second circuit connecting element 103b may be formed in a similar manner and of similar material of the first light emitting element 101a, the second light emitting element 101b, the first power line 102a, the second power line 102b and the second circuit connecting element 103b, and thus the details of these elements will not be repeated here.

As shown in FIG. 4, the electronic device of the present disclosure may be expanded by aforementioned configuration according to the requirements of the actual product. Therefore, the electronic device of the present disclosure may also be applied to some large-sized display devices. It should be noted that the present disclosure is not particularly limited to two partitions, and if necessary, there may be multiple partitions without violating the spirit of the present disclosure.

Figure 5:
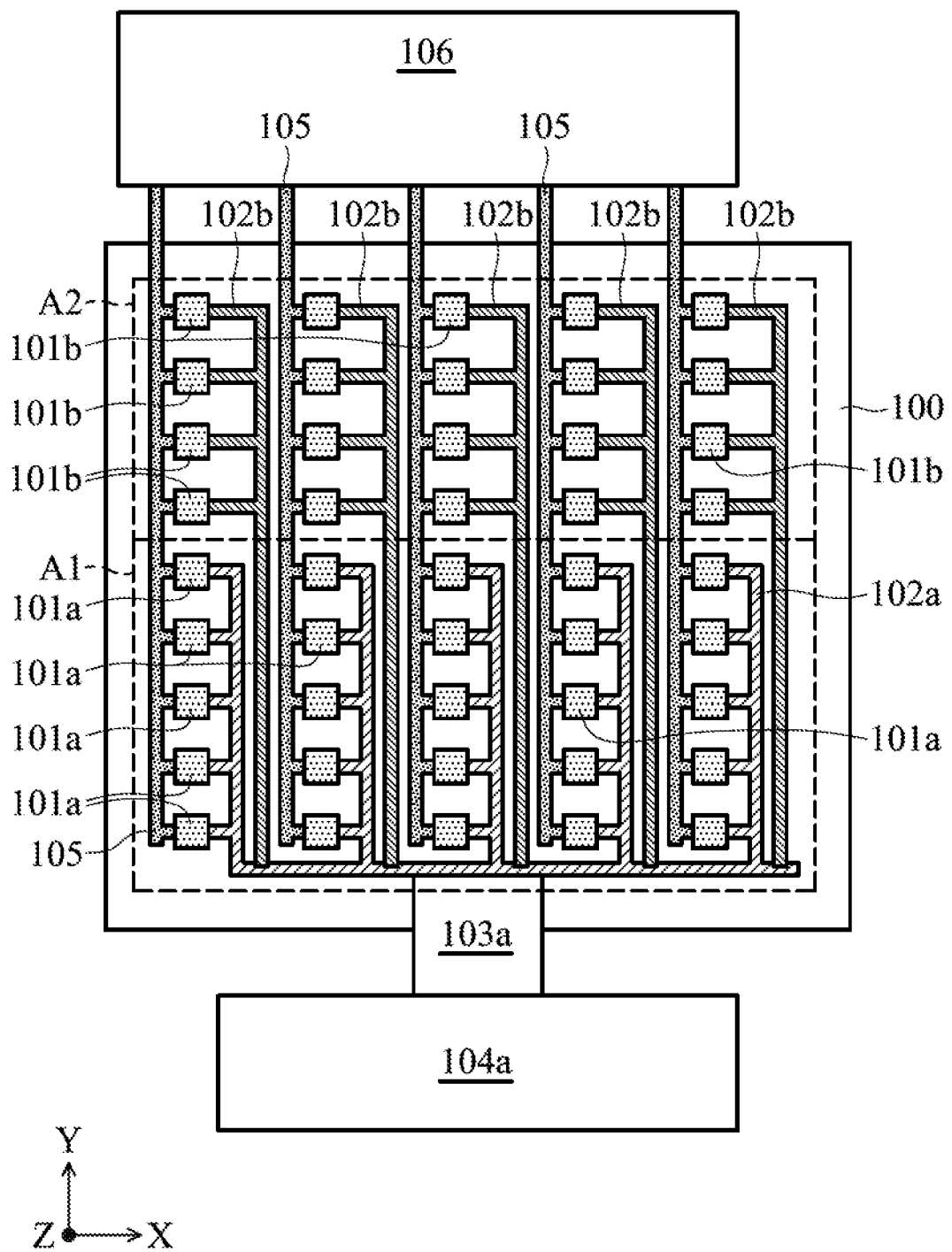

Next, please refer to FIG. 5. The electronic device 60 of FIG. 5 is a schematic top-view according to some embodiments of the present disclosure. The electronic device 60 has substantially the same configuration with the electronic device 10, except that the electronic device 60 further includes a data line 105 and a data driving element 106 in order to further control the first light emitting elements 101a and the second light emitting elements 101b on the substrate 100. The data driving element 106 is electrically connected to the first light-emitting elements 101a and the second light-emitting elements 101b through the data line 105 to supply the data signal to the first light-emitting elements 101a and the second light-emitting elements 101b. The data driving element 106 may be disposed on a suitable circuit substrate (such as the circuit substrate of the first power supply element 104a), and the data driving element 106 may also include an integrated circuit chip. The integrated circuit chip may be disposed on a circuit connecting element (not shown) connecting the circuit substrate and the substrate 100 by flip chip technology (for example, the chip on film (COF)), or directly formed on the circuit connecting element by related thin film processes. In some embodiments, the data line 105 of the electronic device 60 may be formed in the same manner as previously described to form the first power line 102a and the second power line 102b, and the circuit connection element may be an element which is similar to the first circuit connecting element 103a previously described.

As shown in FIG. 5, in some embodiments, when the first light-emitting elements 101a and the second light-emitting elements 101b form a rectangular array, the data lines 105 may be electrically connected to the driving circuit of the first light-emitting elements 101a and the driving circuit of the second light-emitting element 101b simultaneously, wherein the first light-emitting elements 101a and the second light-emitting element 101b are in the same column (arranged along the Y direction in FIG. 5).

Figure 6:
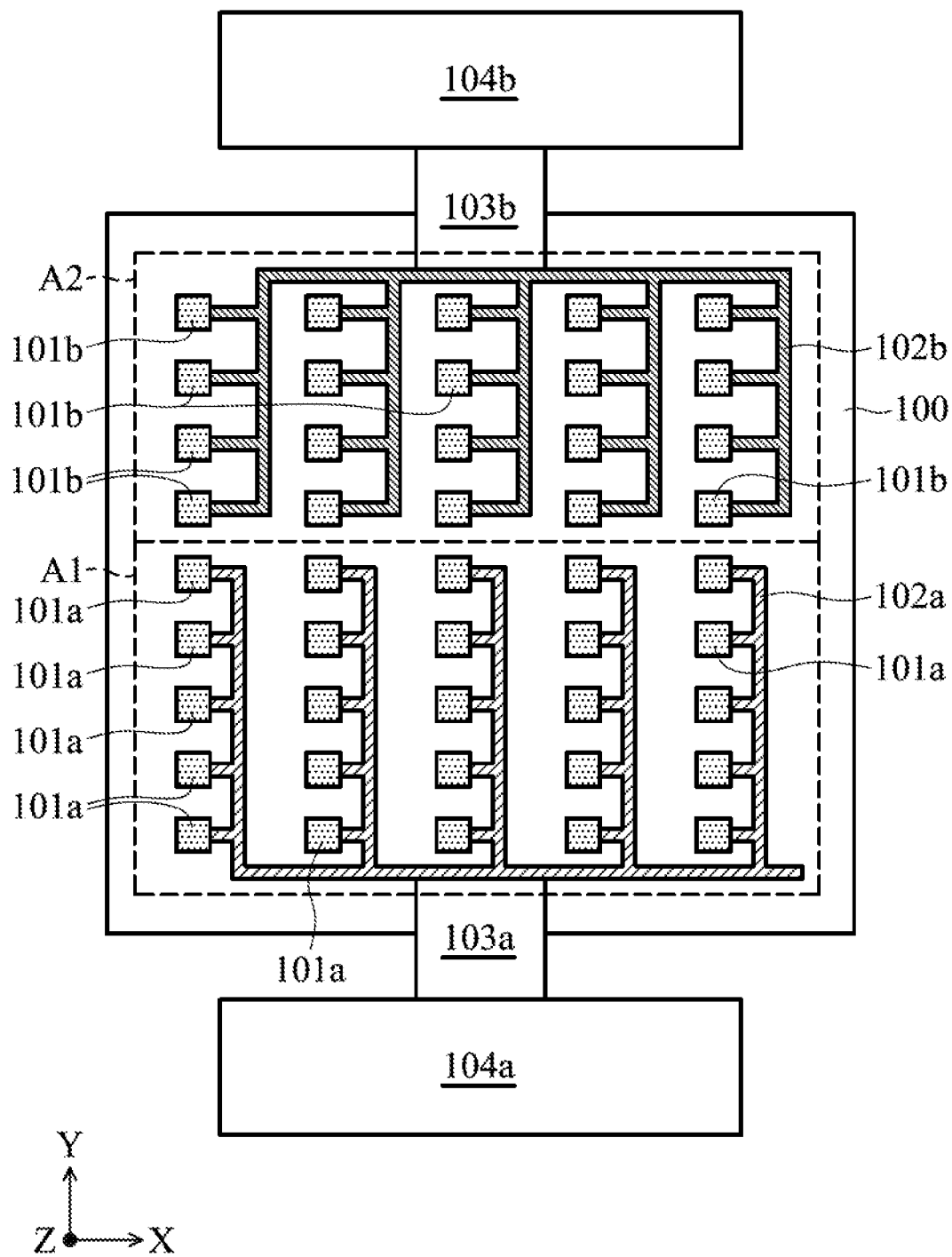

Next, please refer to FIG. 6. FIG. 6 is a schematic top-view of an electronic device 70 in accordance with some embodiments of the present disclosure. In order to make the second light-emitting elements 101b in the second area A2 and the first light-emitting elements 101a in the first area A1 have close luminous intensity, the electronic device 70 may include a second circuit connecting element 103b electrically connected to the second power line 102b, and a second power supply element 104b electrically connected to the second circuit connecting element 103b. Thus, the driving current can be respectively supplied to the second light-emitting elements 101b in the second region A2 and the first light-emitting elements 101a in the first region A1 by different power supply elements. Since the first power supply element 104a does not need to simultaneously drive the first light-emitting elements 101a and the second light-emitting elements 101b, the luminous intensity of the second light-emitting elements 101b may be further adjusted to make the first light-emitting elements 101a and the second light-emitting elements 101b have similar luminous intensities or improve the overall brightness uniformity of the light-emitting element array. In some embodiments, the second power supply element 104b may be closer to the second area A2 than the first area A1. The second circuit connecting element 103b and the second power supply element 104b may be similar to the first circuit connecting element 103a and the first power supply element 104a respectively described above, and thus the details of these elements will not be repeated herein.

Figure 7:
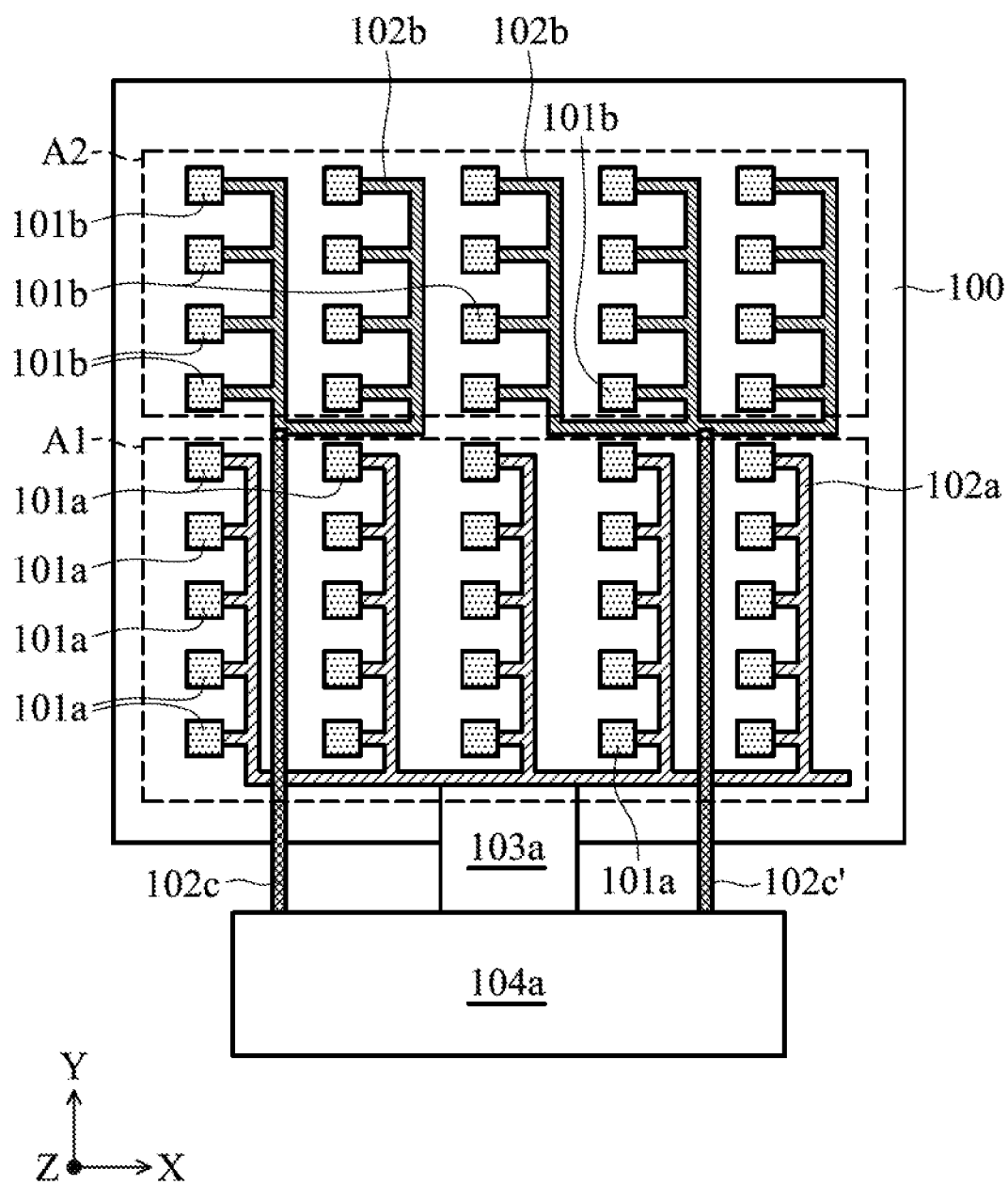

Next, please refer to FIG. 7. FIG. 7 is a schematic top-view of the electronic device 80 in accordance with some embodiments of the present disclosure. In some embodiments, the electronic device 80 may include a third power line 102c, and the second power line 102b may be electrically connected to the first power supply element 104a through the third power line 102c. By this circuit arrangement, the second power line 102b may be electrically connected to the first power supply element 104a directly, and do not have to pass the first power line 102a. Therefore, the driving current that provided by the first power supply element 104a will not be diminished by the impedance (resistance) of the first power line 102a on which the first light-emitting elements 101a are loaded. Thus, the luminous intensity of the second light-emitting elements 101b in the second region A2 are not excessively decreased, so that the electronic device as a whole has a uniform luminous intensity or the overall brightness uniformity of the light-emitting array may be improved. It should be noted that there is no electrical connection between the power line 102c and the first power line 102a in FIG. 7.

In some embodiments, the material and the fabrication method of the third power line 102c of the electronic device 80 may be similar to the first power line 102a and the second power line 102b previously described. For example, in some embodiments, the third power line 102c may be a metal wire that is not in direct contact the substrate 100, such as a copper wire that is connected between the second power line 102b and the first power supply element 104a. That is, at least a portion of the third power line 102c is not in direct contact with the substrate 100. In other embodiments, the material of the third power line 102c is different from that of the second power line 102b, or the third power line 102c and the second power line 102b may have different impedance (resistance). In some embodiments, the impedance (resistance) difference between the third power line 102c and the second power line 102b ((second power line impedance$_{(large)}$–third power line impedance$_{(small)}$)/second power line impedance$_{(large)}$)*100%) may range from 70% to 99%.

According to some embodiments, the electronic device provided by the present disclosure may be applied to, for example, a backlight of a non-self-illumination display device, or directly as a display of the display device, but is not limited thereto. For example, the electronic device can be applied to a display (such as an OLED display, a QLED display, a micro LED display, a mini LED display, or a flexible display), a sensing device, a tiled electronic device, or the like.

In summary, the present disclosure provides an electronic device. The electronic device may, through adjusting the circuit arrangement, make the second light-emitting elements remote from the first power supply element have a luminous intensity close to the first light-emitting elements close to the first power supply element, or may have an improved uniformity of luminous intensity. The luminous intensity of the whole light-emitting array may become much more even, so that the light-emitting array may provide a better viewing experience.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
a display device;
a backlight unit comprising a first electronic unit and a second electronic unit, wherein the first electronic unit comprises a plurality of first light-emitting elements, wherein the plurality of first light-emitting elements are inorganic light emitting diodes;
wherein the second electronic unit comprises a plurality of second light-emitting elements, wherein the plurality of second light-emitting elements are inorganic light emitting diodes;
a first flexible connecting element;
a second flexible connecting element; and
a printed circuit board,
wherein the plurality of first light-emitting elements are electrically connected to the printed circuit board through the first flexible connecting element, and the plurality of second light-emitting elements are electrically connected to the printed circuit board through the second flexible connecting element,
wherein at least two of the plurality of first light-emitting elements are electrically connected directly through a connecting line,
wherein the connecting line comprises a first part extending in a first direction and a second part extending in a second direction, and the first direction is different from the second direction,
wherein the first part has a first width along the second direction, the second part has a second width along the first direction, and the first width and the second width are different.

2. The electronic device as claimed in claim 1, wherein the first flexible connecting element is a flexible flat cable.

3. The electronic device as claimed in claim 1, wherein the first flexible connecting element is a flexible printed circuit.

4. The electronic device as claimed in claim 1, wherein the printed circuit board is a driving circuit board providing a driving voltage to the plurality of first light-emitting elements.

5. The electronic device as claimed in claim 1, wherein at least two of the plurality of second light-emitting elements are electrically connected.

6. The electronic device as claimed in claim 1, wherein the backlight unit comprises a substrate, the plurality of first light-emitting elements are disposed on the substrate, and the connecting line are disposed on the substrate.

7. The electronic device as claimed in claim 6, wherein another of the plurality of first light-emitting elements is electrically connected to the at least two of the plurality of first light-emitting elements through another connecting line, and the another connecting line is disposed on the substrate.

* * * * *